US006917246B2

(12) United States Patent
Thompson

(10) Patent No.: US 6,917,246 B2
(45) Date of Patent: Jul. 12, 2005

(54) DOHERTY BIAS CIRCUIT TO DYNAMICALLY COMPENSATE FOR PROCESS AND ENVIRONMENTAL VARIATIONS

(75) Inventor: Philip H. Thompson, Mt. Vernon, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 10/800,265

(22) Filed: Mar. 12, 2004

(65) Prior Publication Data

US 2004/0174213 A1 Sep. 9, 2004

Related U.S. Application Data

(62) Division of application No. 09/951,788, filed on Sep. 10, 2001, now Pat. No. 6,731,173.

(51) Int. Cl.[7] .................................................. H03F 3/04
(52) U.S. Cl. ........................................ 330/295; 330/296
(58) Field of Search ................................. 330/288, 289, 330/295, 296, 298

(56) References Cited

U.S. PATENT DOCUMENTS 5,739,723 A * 4/1998 Sigmon et al. ............. 330/295
5,757,229 A   5/1998 Mitzlaff
6,097,252 A * 8/2000 Sigmon et al. ............. 330/136
6,262,629 B1   7/2001 Stengel et al.
6,285,251 B1 * 9/2001 Dent et al. .................. 330/127

FOREIGN PATENT DOCUMENTS

WO    WO 97/20385   *  6/1997  ............. H03F/3/68

* cited by examiner

Primary Examiner—Khanh V. Nguyen
(74) Attorney, Agent, or Firm—The Eclipse Group

(57) ABSTRACT

The invention includes a Doherty power amplifier system having a Doherty power amplifier electrically connected to a Doherty bias circuit. The Doherty amplifier includes a carrier amplifier and peaking amplifier. The Doherty bias circuit includes a current mirror and a first node that works to maintain a constant current in the current mirror as a function of a base voltage at the first node. The base voltage that results in a constant current is passed from a current mirror circuit to the carrier amplifier. The base voltage is at least one of scaled and shifted to produce a second voltage at a second node by employing a scaling/level shifting circuit. The scaling/level shifting circuit includes an input electronically connected to the current mirror circuit. The second voltage is passed through a voltage buffer to the peaking amplifier. An effect of the invention is to generate bias voltages for a Doherty amplifier that dynamically adjust to compensate for manufacturing process and environmental changes.

10 Claims, 5 Drawing Sheets

DOHERTY BIAS CIRCUIT TO DYNAMICALLY COMPENSATE FOR PROCESS AND ENVIRONMENTAL VARIATIONS

RELATED APPLICATIONS.

This application claims priority to and is a Divisional Patent Application of U.S. patent application Ser. No. 09/951,788, entitled DOHERTY BIAS CIRCUIT TO DYNAMICALLY COMPENSATE FOR PROCESS AND ENVIRONMENTAL VARIATIONS, filed on Sep. 10, 2001 now U.S. Pat. No. 6,731,173.

BACKGROUND OF THE INVENTION

1. Technical Field.

This invention relates generally to radio frequency (RF) integrated circuits, and more particularly, to RF integrated circuits utilizing a Doherty amplifier.

2. Related Art.

Wireless transmission devices such as cellular phone handsets, cellular base stations, and radio or TV transmitters employ a transmit signal to convey information within a communication system. To boost the transmit signal in these wireless devices, the signal may be passed through one or more power amplifiers. The ratio of transmitted power delivered by the power amplifier to the power consumed by the power amplifier is defined as efficiency. It is desirable that the power amplifier operates as efficiently as possible to minimize heat generated within the power amplifier. Moreover, where a battery powers the wireless device, it is desirable that the power amplifier operates as efficiently as possible to minimize the current drain on the battery.

Efficiency is only one consideration for a power amplifier. To guarantee system performance under worst-case conditions, a wireless device is designed to transmit at a specified Maximum Output Power. However, where the signal at a receiving device is of adequate strength or where a modulation scheme used in the communications system produces instantaneous variations (peaks and nulls) in the amplitude of the transmitted signal (e.g. analog AM modulation and numerous digital modulation schemes), a wireless device may typically operate at a power level below the Maximum Output Power.

With respect to Maximum Output Power, power amplifiers may be categorized as linear or non-linear. The bias or direct current (DC) operating point of an amplifier determines if an amplifier is linear or nonlinear. Amplifiers are further categorized in classes. In order of ascending efficiency and descending linearity, the classes include Class A, Class AB, Class B, and Class C.

An output signal of a linear amplifier is nearly identical to its input signal except that it is amplified by the gain of the amplifier. For example, if the input signal is increased, the output signal will increase by the same amount. An output signal of a non-linear amplifier may be different from its input signal. For example, an increase in the input signal of a non-linear amplifier may not result in an increase in the output signal if the amplifier is "saturated." The same is true if the amplifier is operating at its Maximum Output Power. In general, non-linear amplifiers operating at or near the Maximum Output Power are more efficient than linear power amplifiers.

A conventional power amplifier typically operates with a fixed load line (or load impedance). The load line is the impedance (ideally a resistance) that is seen by a transistor or vacuum tube that may make up an amplifier stage. For a given power supply or battery voltage, the load line determines how much power an amplifier can deliver and is chosen as a design parameter to simultaneously achieve the desired Maximum Output Power and peak efficiency.

At power levels below the Maximum Output Power, there is more supply voltage or current available than what is needed for a desired transmit power level. Thus, the conditions for efficiency are no longer optimal at power levels below the Maximum Output Power. Moreover, the efficiency is lower than the peak efficiency value attained at Maximum Output Power.

To improve the efficiency over a conventional power amplifier, circuit designers may employ a Doherty Power Amplifier. The improvement resides in that a load line for a Doherty Power Amplifier may adjust dynamically to maintain high efficiency over a range of output (transmit) powers. Typically efficiency may be optimized over a range of power of 4 to 1, (6 dB).

The Doherty amplifier is named after its inventor, W. H. Doherty, who was responsible for early successful linear amplifier designs in the 1930s. The Doherty amplifier is a well-known linear radio-frequency power amplifier that is divided into two sections, section no. 1 (the "carrier amplifier") and section no. 2 (the "peaking amplifier"). Section no. 1 typically is a Class B or Class AB type linear power amplifier and section no. 2 typically is a Class C type non-linear power amplifier.

It is a challenge to properly bias each of the two different types of amplifiers in a Doherty amplifier. Bias is required to ensure that the respective amplifiers only draw current and conduct at the appropriate load power signal levels. This challenge is made more difficult by manufacturing process variations and environmental variations.

For example, the operating point of one Doherty amplifier to the next may vary due to slight changes in the manufacturing of each device having the Doherty amplifier. Moreover, a wireless device employing a Doherty amplifier may be required to operate over a wide range of temperatures. Further, the power supply voltage to the Doherty amplifier may experience fluctuations as the battery repeatedly is cycled through charge and discharge periods.

Thus, for a Doherty amplifier, there is a need to generate appropriate bias signals, a need for a circuit that is capable of generating these bias signals, and a need for a circuit that is capable of dynamically compensating for process and environmental variations while generating these control signals. In particular, there is a need to develop such a circuit that may be implemented in a high volume/low cost Doherty Power Amplifier suitable for wireless devices such as cellular phones and other personal communications devices.

SUMMARY

Broadly conceptualized, the Doherty bias circuit provides controlling bias to both the carrier and peaking amplifier sections of a Doherty amplifier while dynamically compensating each controlling bias for manufacturing process changes and temperature or power supply voltage environmental variations. An example implementation of the system architecture of the Doherty bias circuit includes a current mirror that is utilized to establish a Class AB bias voltage for a "carrier" amplifier, and a Class C bias circuit that scales or level shifts the Class AB bias voltage to an appropriate Class C bias voltage. The Class C bias circuit also provides adequate buffering to supply this Class C bias voltage to a "peaking" amplifier.

In an example, the current mirror may include a current source, a voltage follower, and a reference transistor connected in such a way that a constant collector (or drain) current is established in the reference transistor. This permits the base (or gate) bias voltage of the reference transistor to be mirrored over to the carrier amplifier such that a stable current may be established in the carrier amplifier. As environmental conditions such as power supply voltage and temperature vary, the base (or gate) bias voltage applied to the carrier amplifier transistor automatically adjusts to maintain a stable collector (or drain) current.

The bias voltage for the carrier amplifier also may be routed to a Class C bias circuit. In the Class C bias circuit, the bias voltage is sensed, processed, and buffered to generate a Class C bias voltage to the peaking amplifier. The processing function involves the appropriate shifting or scaling of the direct current level of the bias. Because the bias voltage to the peaking amplifier is based on a bias voltage of a similar device that automatically compensates for environmental conditions (namely, the carrier amplifier), the Class C peaking amplifier bias also receives this compensation. With both the carrier amplifier and the peaking amplifier compensating for process and environmental changes, the Doherty amplifier now may perform properly over a wide range of operating conditions.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

DETAILED DESCRIPTION

Figure 1:
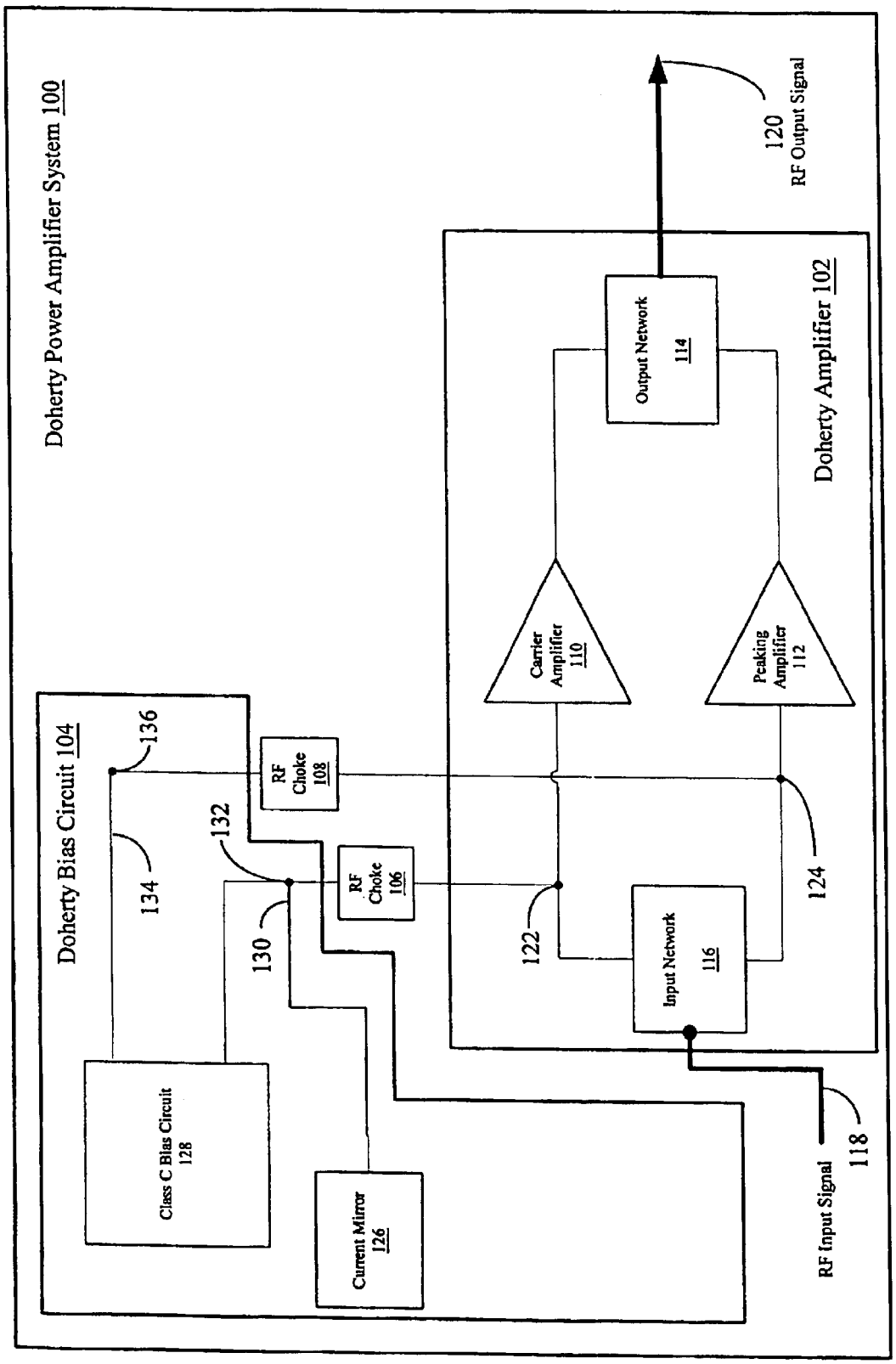
FIG. 1 illustrates a system 100 as an exemplary Doherty power amplifier system.

FIG. 1 illustrates a system 100 as an exemplary Doherty power amplifier system. The system 100 may include a Doherty amplifier 102, a Doherty bias circuit 104, a radio frequency "RF" choke 106, and an RF choke 108. The ratio of transmitted power delivered by the Doherty amplifier 102 to the power consumed by the Doherty amplifier 102 is defined as efficiency. In operation, the system 100 automatically works to optimize efficiency as the load power level requirements vary while dynamically compensating for process and environmental variations.

The Doherty amplifier 102 may be any device having amplifiers that cooperate to efficiently produce output signals over a wide range of load power level requirements. In one embodiment, the Doherty amplifier 102 may include a carrier amplifier 110, a peaking amplifier 112, an output network 114, and an input network 116. The carrier amplifier 110 may be electrically connected to the output network 114 and may be electrical connected in parallel to the peaking amplifier 112. The peaking amplifier 112 may be electrically connected to the input network 116.

The output network 114 may work to shift the phase of one input signal +/−90 degrees relative to another input signal and to combine the outputs of the carrier amplifier 110 and the peaking amplifier 112 such that the outputted signals combine in phase. The output network 114 may also present load impedances to the carrier amplifier 110 and the peaking amplifier 112 that dynamically adjust as the output power of the combined amplifier is varied. Since the Doherty amplifier is a linear amplifier, the output power is increasing as the input power is increased. Moreover, since conventional power amplifiers lack a dynamically adjusting load impedance, a dynamically adjusting load impedance provides high efficiency over a wider range of output power than could be achieved using a conventional power amplifier.

The input network 116 may perform the functions of splitting the RF input signal 118 into multiple output signals and shifting the phase of one output signal +/−90 degrees relative to the other output signal. Moreover, the input network 116 may provide amplification for each output signal.

For the Doherty amplifier 102, the carrier amplifier 110 may be a linear or quasi-linear amplifier such as a Class B or Class AB type power amplifier. The peaking amplifier 112 may be a non-linear Class C type power amplifier. In operation, the Doherty amplifier 102 may receive a radio frequency "RF" input signal 118 at the input network 116 and output an RF output signal 120 from the output network 114.

The Doherty bias circuit 104 may include components that dynamically compensate for process and environmental variations while generating signals to control the operations of the Doherty Amplifier 102. To accomplish this, the Doherty bias circuit 104 may provide a bias signal to each amplifier within the Doherty amplifier 102. These bias signals may be in the form of a DC (Direct Current) voltage or current. In one embodiment, the Doherty bias circuit 104 may provide a bias voltage signal at node 122 to the carrier amplifier 110 and provide a bias voltage signal at node 124 to the peaking amplifier 112.

The Doherty bias circuit 104 may include a current mirror circuit 126 and a Class C bias circuit 128. The current mirror circuit 126 may be any circuit building blocks designed to reproduce a reference direct current (dc) from one location to one or more locations. The produced current may be constant multiples of the reference direct current. The Class C bias circuit 128 may be any circuit building blocks that develop an appropriate direct current (DC) bias for a class C amplifier.

The Doherty bias circuit 104 may operate as follows. The current mirror circuit 126 may establish a first bias voltage 130 at node 132 for the carrier amplifier 110. Since the current mirror circuit 126 is subject to process or environmental changes that are also experienced by the carrier amplifier 110, the first bias voltage 130 may include information that may be used to compensate for process or environmental changes.

Where the carrier amplifier 110 is an AB type power amplifier, the first bias voltage 130 may be referred to as a Class AB bias voltage 130. The Class AB bias voltage 130 is applied to an input of the carrier amplifier 110 through the RF choke 108. The RF choke 108 may block RF signals present at node 122 from conducting to node 130. This works to prevent these RF signals from interfering with the operation of the current mirror circuit. The Class AB bias voltage 130 is also routed to an input of the Class C Class C bias circuit 128. As a function of the Class AB bias voltage 130, the Class C Class C bias circuit 128 generates a Class C bias voltage 134 at node 136. Since the Class C Class C bias circuit 128 generates the Class C bias voltage 134 as a function of the Class AB bias voltage 130, the Class C bias voltage 134 tracks the Class AB bias voltage 130 so as to include any information required to compensate for process or environmental changes. The Class C bias voltage 134 is applied to an input of the peaking amplifier 112 through the RF choke 110. Both the carrier amplifier 110 and the peaking amplifier 112 may feed their signals into the output network 114 to produce the RF output signal 120.

An integrated circuit chip may be employed in the invention. Here, an integrated circuit chip may be viewed as a microelectronic semiconductor device consisting of many interconnected transistors and other components. These chips may be constructed ("fabricated") on a small rectangle (a "die") cut from a semiconductor wafer substrate. An example of a semiconductor wafer substrate includes a silicon wafer substrate. For special applications, Silicon Germanium, Gallium Arsenide, or other semiconductor types may be used for the wafer substrate. System 100 in whole or in part may be embedded within the die of a solid-state (i.e., semiconductor) integrated circuit chip ("IC") and act in response to load power level requirements. The solid-state IC may be, for example, a complementary metal oxide semiconductor (CMOS) IC or a Gallium Arsenide (GaAs) IC.

Figure 2:
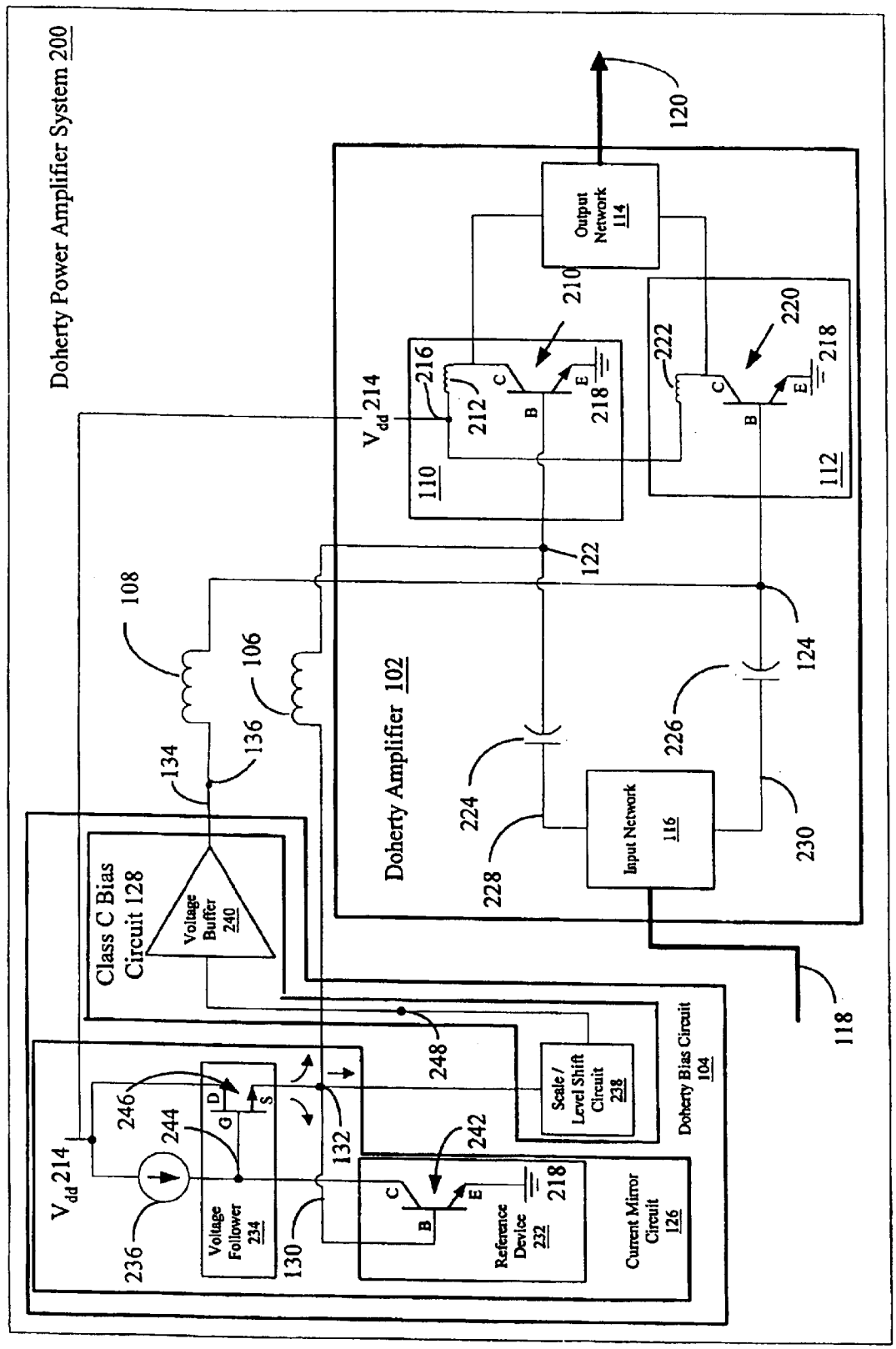
FIG. 2 illustrates a circuit diagram as an exemplary implementation of the Doherty power amplifier system 200.

In FIG. 2, a circuit diagram illustrating an exemplary implementation of the Doherty power amplifier system 200 is shown. In one embodiment, the Doherty power amplifier system 200 may be based on the Doherty power amplifier system 100 of FIG. 1.

The carrier amplifier 110 may include a transistor 210 and an inductor 212. The transistor 210 may include a base B (or gate G), a collector C (or drain D), and an emitter E (or source S). The collector C of the transistor 210 may be connected to a DC power source Vdd 214 through the inductor 212 at node 216. The emitter E of the transistor 210 may be connected to ground 218 and the base B may be connected to node 122. In one embodiment, the transistor 210 may be a bipolar transistor.

Similar to the carrier amplifier 110, the peaking amplifier 112 may include a transistor 220. The transistor 220 may include a base B (or gate G), a collector C (or drain D), and an emitter E (or source S). The collector C of the transistor 220 may be connected to the DC power source Vdd 214 through an inductor 222 at node 216. The emitter E of the transistor 220 may be connected to ground 218 and the base B of the transistor 220 may be connected to node 124.

The Doherty amplifier 102 may also include a capacitor 224 and a capacitor 226. A carrier input signal 228 and a peaking input signal 230 may be both filtered by capacitors 224 and 226, respectively. The capacitors 224 and 226 may filter out any DC component of the RF input signal 118 so that only RF may be input in the carrier amplifier 110 and the peaking amplifier 112.

Figure 4:
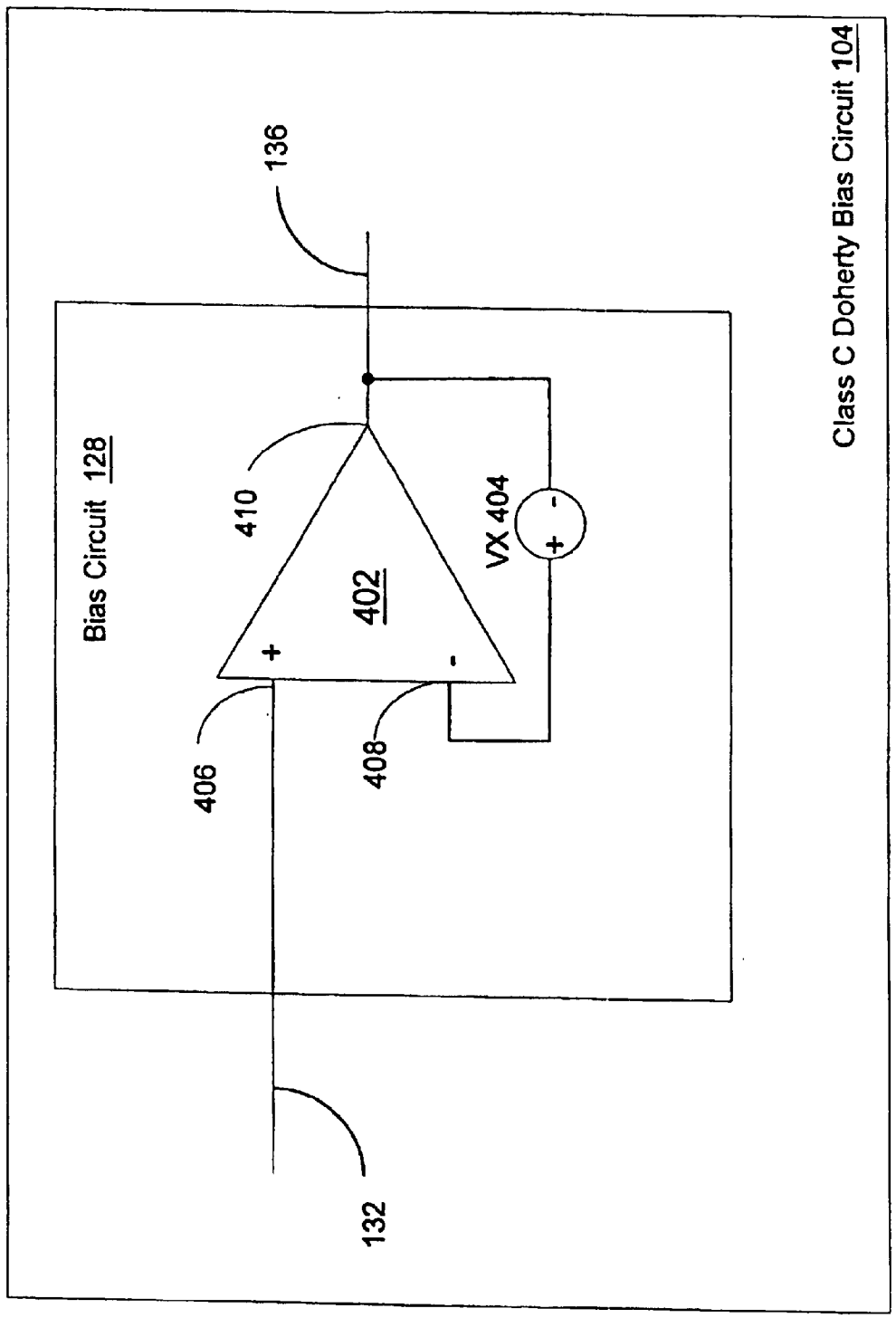
FIG. 4 is an example block diagram level implementation of the Class C bias circuit 128 within the Doherty bias circuit 104 of FIG. 1 or FIG. 2.

Recall that the Doherty bias circuit 126 may include a current mirror 126 and a class C Class C bias circuit 128. As seen in FIG. 2, the current mirror circuit 126 may include a reference device 232, a voltage follower 234, and a current source 236. The Class C bias circuit 128 may include a scaling/level shifting circuit 238 and a voltage buffer 240. The functions of the scaling/level shifting circuit 238 and the voltage buffer 240 may be combined in a single circuit (as indicated in FIG. 4).

The reference device 232 may include a transistor 242. The transistor 242 may include a base B (or gate G), a collector C (or drain D), and an emitter E (or source S). The collector C of the transistor 242 may be connected to the current source 236 at node 244. The emitter E of the transistor 242 may be connected to ground 218 and the base B may be connected to node 132. To permit the current in the reference device 232 to be mirrored or replicated in the carrier amplifier 10, it is important that transistor 242 is subject to the same environmental and manufacturing process conditions as the transistors used in the carrier amplifier 110 and the peaking amplifier 112.

For system 100, it is critical that the carrier amplifier 110 and the reference device 232 be on the same die so that the reference device 232 is subject to the same environmental and manufacturing process conditions as the carrier amplifier 110. The peaking amplifier 112 is ideally located on the same integrated circuit as the carrier amplifier 110 and reference device 232 so that all three-circuit components are subject to the same environmental and manufacturing process conditions. In order to mitigate RF isolation or circuit layout issues, the peaking amplifier 112 may optionally be located on a different integrated circuit However, the peaking amplifier 112 must have properties and characteristics (such as being fabricated on the same wafer) that are similar to the carrier amplifier 110. Moreover, the peaking amplifier 112 must also be exposed to the same environmental conditions, such as temperature. The Class C Class C bias circuit 128 of the Doherty bias circuit 104 may be located in whole or in part in an external discrete circuit, on an integrated circuit (IC) separate from the IC of the current mirror circuit 126, on the same integrated circuit as the current mirror circuit 126, or on the same integrated circuit as the carrier amplifier 110 and the peaking amplifier 112.

The voltage follower 248 may include a transistor 246. The transistor 246 may include a gate G (or base B), a drain D (or collector C), and a source S (or emitter E). The drain (D) of the transistor 246 may be connected to the DC power source Vdd 214. The source (S) of the transistor 246 may be connected to node 132 and the gate G may be connected to the current source 236 and reference device 232 through node 244. The transistor 246 may be configured as a source follower (or emitter follower) to produce an output at node 132 that tracks the voltage at node 244.

The current source 236 may provide a current to the collector C of the reference device 232 as a constant current.

In operation, the current source 236 works to feed a constant current into the collector C of the reference device 232. Because a voltage follower circuit ideally has a high input impedance no significant current is fed into the gate or base of the voltage follower circuit 234. A voltage at node 132 at the base B of the reference device 232 adjusts to maintain the current fed into the collector C of the reference device 232 independent of manufacturing process or environmental conditions. Moreover the voltage at node 132 is applied to the base B of the carrier amplifier transistor 210 so that the bias conditions of the transistor 210 "mirror" the bias conditions of the transistor 242. This works to establish a constant collector C current for the carrier amplifier transistor 210.

The voltage signal at node 132 may then be input into the class C Class C bias circuit 128 at the scaling/level shifting circuit 238. On receiving this voltage signal, the scale/level shift circuit 238 works to level shift or to scale the voltage signal at node 132 to a new voltage at node 248. In other words, The scale/level shift circuit 232 may produce at node 248 a scaled or level shifted replica of the voltage signal at node 132. The voltage at node 248 may be input into the voltage buffer 240.

The voltage buffer 240 may produce a voltage signal that has the same value (i.e., magnitude) at node 136 as the voltage signal at node 248. Here, the voltage buffer 240 may produce an identical (buffered) bias voltage 134 at node 136. The bias voltage 134 may then be applied to the peaking amplifier 112 through the RF choke 108. In operation, the voltage buffer 234 may act to permit the peaking amplifier 112 to draw as much base current as the peaking amplifier 112 requires without affecting the upstream voltage signal value at node 248.

In one embodiment, the peaking amplifier 110 and the carrier amplifier 112 each are a Gallium Arsenide chip, and the current source 236, the voltage follower 234, and the voltage buffer 240 are integrated on a single CMOS chip.

The Doherty bias circuit 104 may include a linear amplifier bias circuit and a non-linear amplifier bias circuit. In one embodiment, the linear amplifier bias circuit may include the current source 236, the reference device 232, and the voltage follower 234. The non-linear amplifier bias circuit may include the scale/level shift circuit 238 and the voltage buffer 240.

Figure 3:
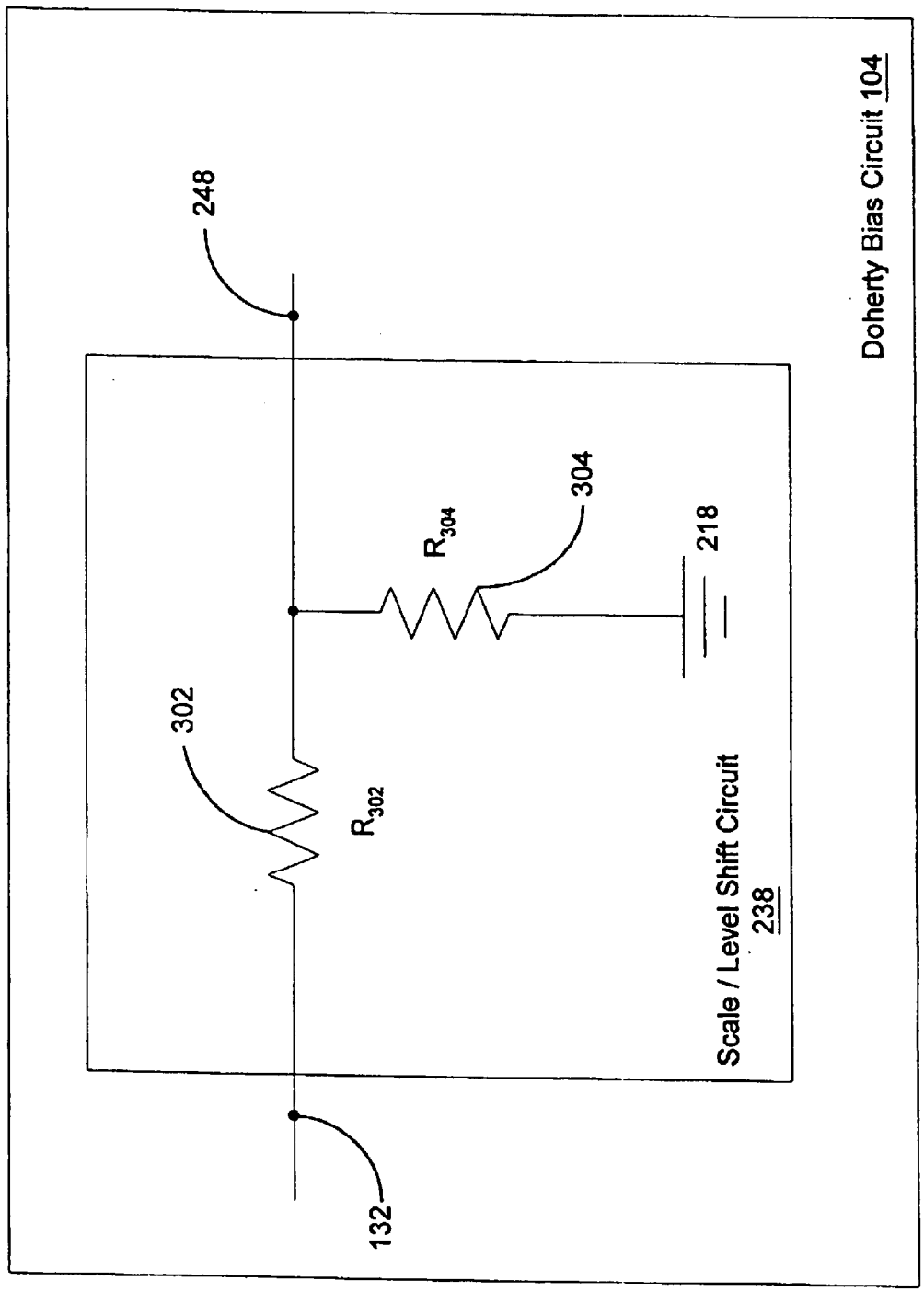
FIG. 3 is an example implementation of the scaling/level shifting circuit 238 of FIG. 2.

FIG. 3 is an example implementation of the scaling/level shifting circuit 238 of FIG. 2. The scaling/level shifting circuit 238 may include a circuit having resistor 302 and resistor 304, each defining a resistance value. The resistance value may be variable as a function of a predetermined condition or the resistance value may be fixed. Resistor 302 may be electrically connected between node 132 and node 248 of FIG. 2.

A first terminal of resistor 304 may be connected to resistor 302 at node 248. A second terminal may be connected to ground 218. In this example implementation, the scaling/level shifting circuit 238 may be a voltage divider that works to cause a voltage drop from node 132 to node 248 that is a function of the resistance values of the resistor 304 and the resistor 306. The voltage at node 248 may be equal to the voltage at node 132 times resistance value of resistor 304 divided by the summation of the resistance values of resistors 302 and 304, namely $$V248 = V232(R304/(R302+R304))  \quad (2).$$

FIG. 4 is an example block diagram level implementation of the Class C Class C bias circuit 128 within the Doherty bias circuit 104 of FIG. 1 or FIG. 2. The Class C Class C bias circuit 128 shown in FIG. 4 may perform both level shift and buffer functions of elements 238 and 240 of FIG. 2.

In one embodiment, the Class C Class C bias circuit 128 may include an operational amplifier 402 and an offset voltage source (VX) 404. The non inverting input 406 of the operational amplifier 402 may be connected to node 132 of FIG. 1 or FIG. 2. The output 410 may be connected to node 136 of FIG. 1 or FIG. 2. The offset voltage source 404 may be electrically connected between the output node 136 and the inverting node 408 of the operational amplifier 404. The operational amplifier 402 and offset voltage source 406 work to produce a buffered output voltage at node 136 that is equal to the voltage at node 132 minus the magnitude of the offset voltage source 404.

Figure 5:
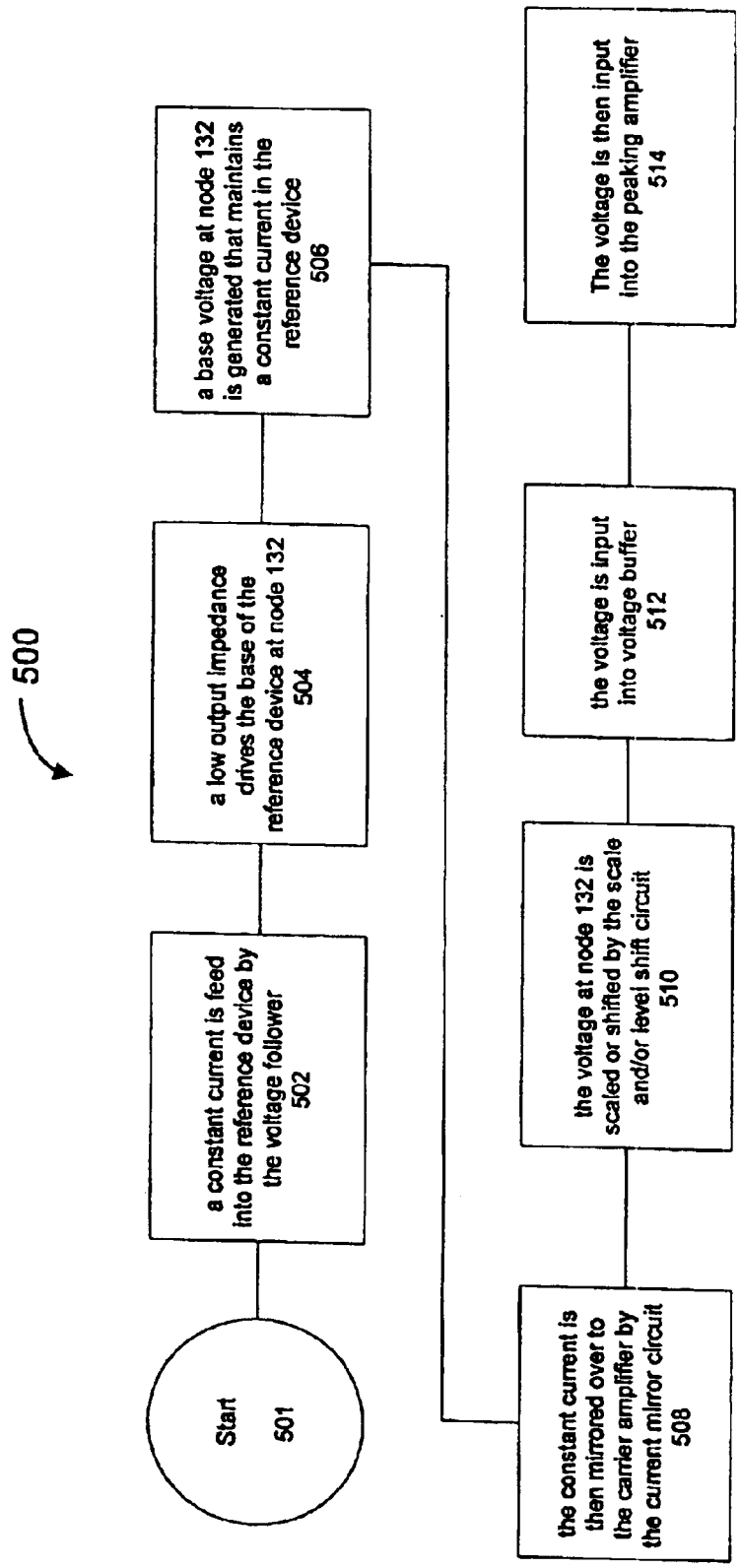
FIG. 5 is a flowchart illustrating the process of biasing the Doherty amplifier system shown in FIG. 1 or FIG. 2.

FIG. 5 is a flowchart 500 illustrating the process of biasing the Doherty amplifier system 100 shown in FIG. 1. The process may start in step 501. In step 502, a constant current may be feed into the reference device 232 of FIG. 2 by the current source 236. In step 504, a low output impedance of the voltage follower 234 may drive the base B of the reference device 232 at node 132. In step 506, a base voltage at node 132 may be generated that maintains a constant current in the reference device 232. In step 508, the constant collector C current may be mirrored over to the carrier amplifier 110. This may permit the collector current of the carrier amplifier 110 to be constant as conditions vary.

In step 510, the voltage at node 132 may be scaled or shifted by the scale/level shift circuit 238 to a voltage at node 248. The voltage at node 248 may be input into the voltage buffer 240 in step 512 to produce a voltage 134 at node 136. The voltage 134 at node 136 may then be input into the peaking amplifier 112 in step 514. With the bases of both transistor 210 and transistor 220 receiving controlling inputs that account for process and environmental variations, the Doherty amplifier may then properly process the RF input signal to produce the RF output signal 120 over a wide range of output signal levels.

While various embodiments of the invention have been described, it will be apparent to those of ordinary skill in the art that many more embodiments and implementations are possible that are within the scope of this invention.

What is claimed is:

1. A circuit, comprising:
 a linear amplifier bias circuit comprising first means for adjusting for process variations and environmental variations; and
 a non-linear amplifier bias circuit comprising second means for adjusting for process variations and environmental variations, wherein the second means for adjusting for process variations and environmental variations is a function of the first means for adjusting for process variations and environmental variations, where the first means is a current mirror.

2. The circuit of claim 1, further comprising:
 a linear amplifier coupled to the linear amplifier bias circuit, wherein
 the linear amplifier bias circuit comprises a reference device that is disposed in relation to the linear amplifier so as to comprise the first means for adjusting for process variations and environmental variations.

3. The circuit of claim 1, wherein the first means for adjusting for process variations and environmental variations comprises means for producing a first voltage and the second means for adjusting for process variations and environmental variations includes means for producing a second voltage that is a function of the first-voltage.

4. The circuit of claim 1, wherein the linear amplifier bias circuit comprises a voltage follower coupled to a reference device, the circuit further comprising:
 a carrier amplifier coupled to the voltage follower.

5. The circuit of claim 4, wherein the non-linear amplifier bias circuit comprises a voltage buffer coupled to a scale/level shift circuit, the circuit further comprising:
 a non-linear amplifier coupled to the voltage buffer, wherein the scale/level shift circuit is coupled to the voltage follower.

6. The circuit of claim 5, wherein the linear amplifier is configured to function as a carrier amplifier and the non-linear amplifier is configured to function as a peaking amplifier in a Doherty amplifier.

7. The circuit of claim 6, wherein the linear amplifier bias circuit is a class AB amplifier bias circuit and wherein the non-linear amplifier bias circuit is a class C amplifier bias circuit.

8. A method, comprising:

adjusting for process variations and environmental variations with a first means in a linear amplifier bias circuit; and adjusting for process variations and environmental variations with a second means in a non-linear amplifier bias circuit, wherein the second means for adjusting for process variations and environmental variations is a function of the first means for adjusting for process variations and environmental variations, where the first means comprises a current mirror.

9. The method of claim 8, further comprising:

biasing a with a linear amplifier bias circuit that is coupled to the liner amplifier, wherein the linear amplifier bias circuit comprises a reference device that is disposed in relation to the linear amplifier so as to comprise the first means from adjusting for process variations and environmental variations.

10. The method of claim 8, wherein the first means for adjusting for process variations and environmental variations comprises means for producing a first voltage and the second means for adjusting for process variations and environmental variations includes means for producing a second voltage that is a function of the first voltage.

* * * * *